United States Patent [19]
Mandai et al.

[11] Patent Number: 5,227,739
[45] Date of Patent: Jul. 13, 1993

[54] VOLTAGE CONTROLLED OSCILLATOR HAVING A RESONATOR

[75] Inventors: Harufumi Mandai; Keiji Asakawa; Yoshikazu Chigodo; Atsushi Inoue; Yo Funada, all of Kyoto, Japan

[73] Assignee: Murata Manufacturing Co., Ltd., Kyoto, Japan

[21] Appl. No.: 808,894

[22] Filed: Dec. 18, 1991

[30] Foreign Application Priority Data

Dec. 20, 1990 [JP] Japan ................. 2-404163

[51] Int. Cl.⁵ ............................................. H03B 5/18
[52] U.S. Cl. ................... 331/96; 331/104 SL; 331/117 D
[58] Field of Search ............ 331/96, 99, 100, 107 SL, 331/108 D, 117 D, 187; 361/412, 414; 333/219

[56] References Cited
U.S. PATENT DOCUMENTS 4,574,255 3/1986 Fujii et al. .................... 331/66 X
4,758,922 7/1988 Ishigaki et al. ................. 333/219 X
5,101,177 3/1992 Norimatsu ..................... 331/108 D

*Primary Examiner*—David Mis
*Attorney, Agent, or Firm*—Wegner, Cantor, Mueller & Player

[57] ABSTRACT

A voltage controlled oscillator having a resonator wherein a substrate is made up of a plurality of dielectric layers; an inductor functioning conductive film and grounding electrode films are each formed at a boundary surface of one of the dielectric layers; the earth electrode films are arranged, in the direction in which the dielectric layers are laminated, at both sides of the conductor functioning conductive film; the inductor functioning conductive film and the grounding electrode films constitute the resonator; and electric lands are formed on the surface of the substrate so that other components of the oscillator are mounted on the surface of the substrate.

8 Claims, 3 Drawing Sheets

VOLTAGE CONTROLLED OSCILLATOR HAVING A RESONATOR

BACKGROUND OF THE INVENTION (1) Field of the Invention

This invention relates to a voltage controlled oscillator used in a communication apparatus, a BS tuner and similar devices.

(2) Description of the Prior Art

Voltage controlled oscillators are often used as local oscillators in various kinds of tuner circuits because the frequency of the oscillators can be adjusted to a desired value according to voltage input therein.

In recent years, all the components of the voltage controlled oscillators have come to be integrated into one chip of a substrate, like other electronic parts.

The voltage controlled oscillators, in many cases, have an integrally formed resonator, so the way to incorporate such a resonator with other components affects the size of the whole construction, oscillating characteristics and so on. FIGS. 1-3 show conventional oscillators, wherein a resonator is incorporated in each of substrates 21, 23 and 26. In FIG. 1, a dielectric block 20 and specified electrodes formed on upper and lower surfaces of the block constitute a resonator 22 which is mounted on the substrate 21.

In FIG. 2, the substrate 23 itself has a so-called microstrip line resonator formed by disposing a conductive film 24 thereon and a grounding electrode 25 thereunder.

In FIG. 3, a capacitor element 27 and an inductor element 28 are mounted on the substrate 26, these elements 27 and 28 being connected with each other by a wiring pattern (not illustrated) to form the resonator.

Such voltage controlled oscillators need to mount such parts as diodes and capacitors on the substrate besides the resonator, which have to be placed on the remaining area on the substrate.

Therefore, the conventional voltage controlled oscillators have the disadvantage of having a large-size construction as a whole because a large substrate is needed to mount a resonator and all other parts on it.

They have another disadvantage that the resonator is easily affected by a magnetic field because it is exposed outside. Shielding the resonator to avoid this with a metal case or the like causes the problem of making the whole size still larger.

SUMMARY OF THE INVENTION

Accordingly, an object of the present invention is to provide a useful voltage controlled oscillator which has a resonator not easily affected by the external magnetic force, and which still has a compact construction.

The above object is achieved by a voltage controlled oscillator having a resonator comprising a substrate made up of a plurality of dielectric layers, wherein an inductor functioning conductive film and grounding electrode films are each formed at a boundary surface of one of the dielectric layers, the grounding electrode films are arranged, in the direction in which the dielectric layers are laminated, at both sides of the inductor functioning conductive film, the inductor functioning conductive film and the earth electrode films constitute the resonator, and electric lands are formed on the surface of the substrate so that other components of the oscillator are mounted on the surface of the substrate.

The conductive film and the grounding electrode films form the strip line type resonator.

The conductive film, the grounding electrode films and the electric lands on the surface of the substrate are connected with one another via through holes filled with conductive material.

In the present invention, the resonator is formed of the electrode films formed at the boundary surfaces of the dielectric layers, which enables the resonator to be built in the substrate. The substrate can be smaller without the need of mounting the resonator on its surface. Also, the earth electrode films exist at both sides of the inductor functioning electrode film to shield it with the advantage of being less affected by external magnetic force Another object of the present invention is to provide a voltage controlled oscillator having a high Q factor.

The above object is achieved by a substrate made from dielectric material capable of firing at a low temperature.

The electrode films are metallic materials with high conductivity and with low melting points.

This makes it possible to employ such low-melting-point materials with high conductivity as Cu and Ag as the conductive material used in the resonator or for shielding, with the great advantages of improving the Q factor and reducing the cost of the production.

Either dielectric material $BaO\text{-}SiO_2\text{-}Al_2O_3$ or dielectric material $BaO\text{-}SrO\text{-}SiO_2\text{-}ZrO_2$ is selected as the substrate and either Ag or Cu is selected as the electrode film and the conductive film.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings.

DESCRIPTION OF THE PREFERRED EMBODIMENTS

Figure 1:
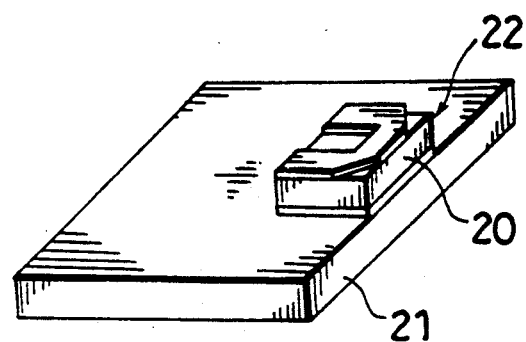
FIGS. 1-3 are views of conventional oscillators, each showing a resonator formed on a substrate.
Figure 2:
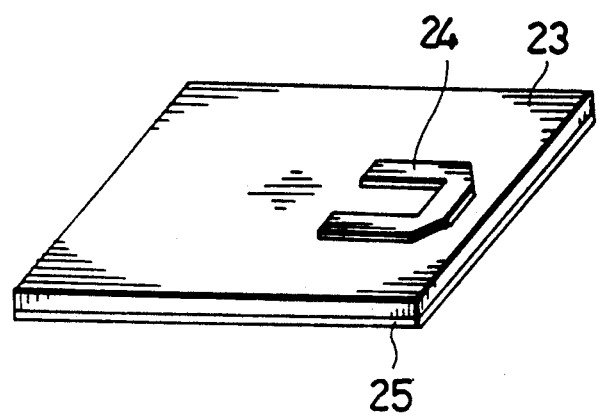
Figure 3:
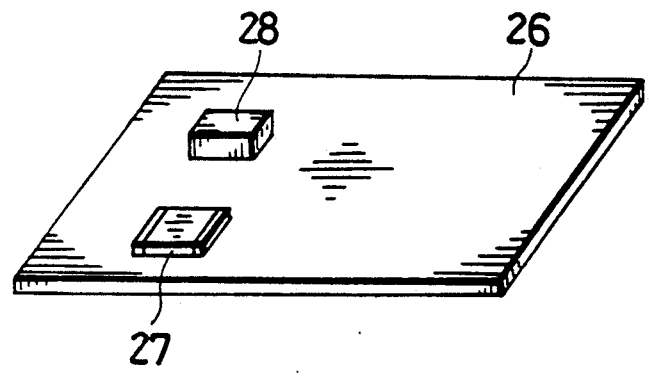
Figure 4:
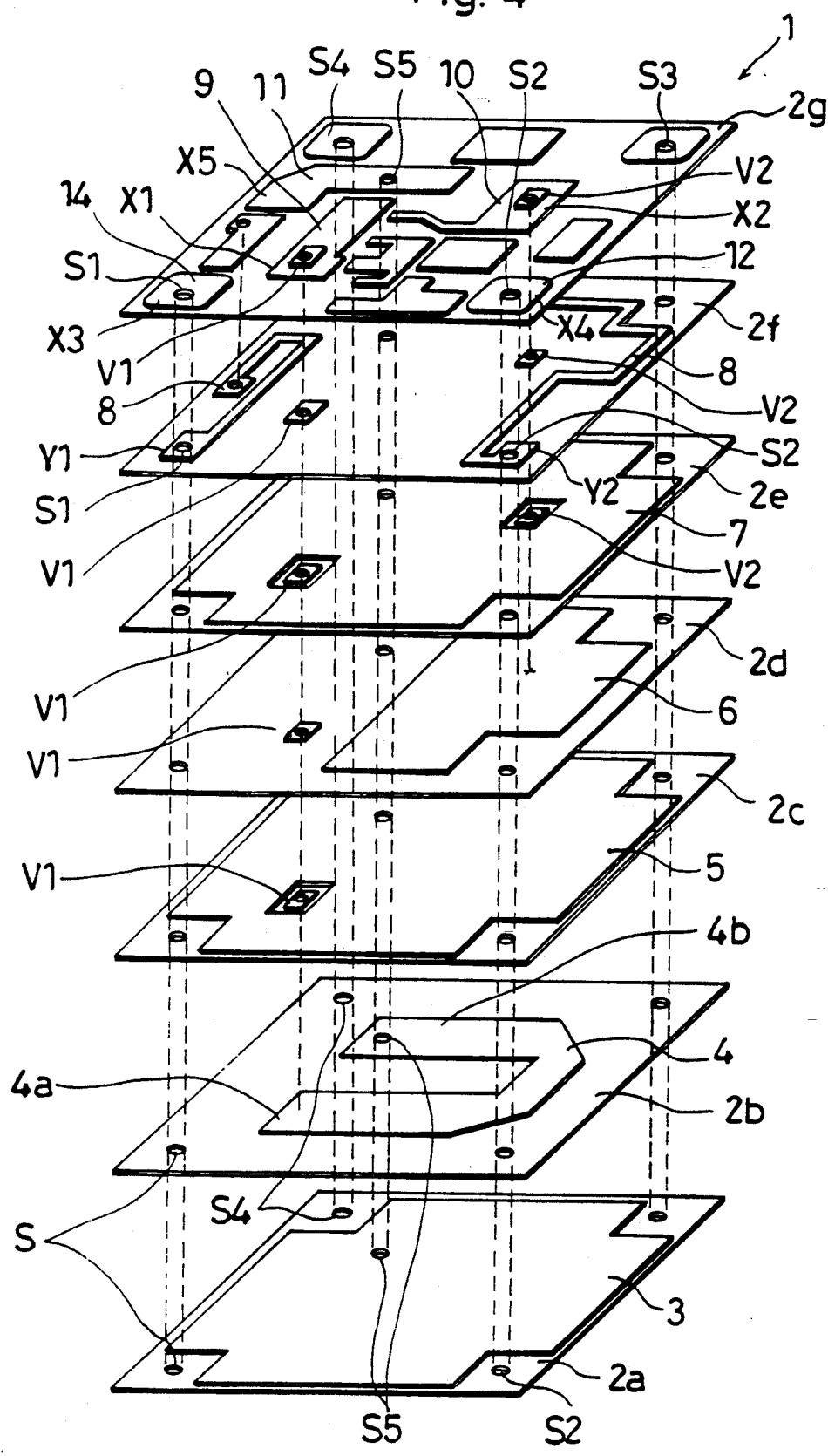
FIG. 4 is an exploded perspective view of an embodiment of a voltage controlled oscillator according to the present invention.
Figure 5:
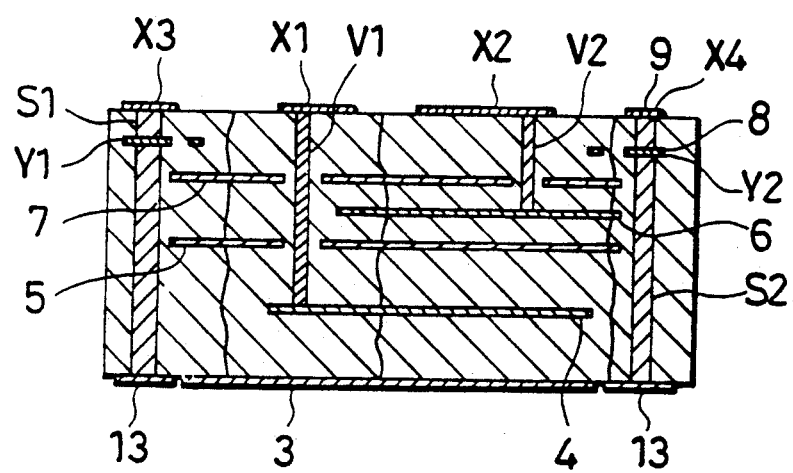
FIG. 5 is a vertical sectional view of the voltage controlled oscillator of FIG. 4.

The following is a description of the embodiments of the present invention based on the drawings. A substrate 1 consists of a plurality of dielectric layers 2—seven layers 2a—2g are laminated in this embodiment—which are made from material capable of being fired at a low temperature of around 1000° C., such as $BaO\text{-}SiO_2\text{-}Al_2O_3$ or $BaO\text{-}SrO\text{-}SiO_2\text{-}ZrO_2$.

Specified patterns are formed, by printing or some other way, using conductive materials such as Cu or Ag on one surface of each dielectric layer 2. More precisely, grounding electrode films 3, 5 and 7 are formed on the nethermost 2a, the third respectively. A meander conductive film 4 functioning as an inductor, a capacitor-forming electrode film 6 and a conductive land for wiring 8 are formed on the second nethermost 2b, the fourth nethermost 2d and the second uppermost 2f of the substrate respectively.

Each of the five upper dielectric 2c–2g has a through hole V1 to connect one end 4a of the conductive film 4 with a first terminal X1 on a conductive land 9 on the upper surface of the substrate 1, and each of the three upper dielectric 2e-2g further has a through hole V2 to connect the capacitor-forming electrode film 6 with a second terminal X2 on a conductive land 10 on the upper surface of the substrate. The above holes V1 and V2 are condensed with conductive materials such as Cu or Ag, and the seven dielectric 2a-2g are pressure-adhered by a presser or similar devices into a lamination. Next, through holes S1-S5 are formed with a drill or similar device at the four corners and near the center of the lamination, these through holes S1-S5 being filled with the same conductive material as above. After an electrode film 13 for receiving the through holes is formed with the conductive material at the four corners and the center of the bottom surface of the lamination (the bottom surface of the dielectric 2a), the layer is simultaneously burned at a comparatively low temperature of around 1000° C. The electrode films and the terminals formed on the upper surface may be screen-printed with conductive material after the substrate is formed. The above earth electrode film 3 can be formed simultaneously with the formation of the electrode film 13. The through hole S1 connects a first terminal Y1 on the conductive land for wiring 8 with a third terminal X3 on the conductive land 14 on the substrate 1, the through hole S2 connects a second terminal Y2 on the conductive land for wiring 8 with a forth terminal X4 on the conductive land 12 on the surface of the substrate 1 and the through hole S5 connects the other end 4b of the conductive film 4, the three earth electrode films 3, 5 and 7 and a fifth terminal X5 on a conductive land 11 on the surface of the substrate 1.

With the substrate of the above construction, a capacitor comprises the grounding electrode films 5 and 7 and the capacitor-forming electrode film 6 disposed therebetween via the dielectric 2d and 2e. The grounding electrode films 5 and 7 are connected with the end 4b of the conductive film 4 via the through hole S5 which leads to the fifth terminal X5 on the conductive land 11. The capacitor-forming electrode 6 leads to the second terminal X2 on the conductive land 10 via the through hole V2, while the end 4a of the conductive film 4 leads to the first terminal X1 on the conductive land 9 via the though hole V1. The conductive film and the grounding electrode films existing on both sides of it form the resonator like a distributed constant circuit.

Therefore, in a voltage controlled oscillator thus formed according to the present invention, the resonator consists of the electrode films 3, 4 and 5 formed between the dielectric layers with the advantage of building the resonator in the substrate 1. The substrate can be smaller without the need of mounting the resonator on its surface. Also, the conductive film is shielded with the grounding electrode films 3 and 7 from both sides with the advantage of being less affected by external magnetic force.

Moreover, in the present invention, the dielectric layers 2 used as the substrate 1 are made from a material which can be burned at a low temperature. This makes it possible to employ such low-melting-point materials with high conductivity as Cu and Ag as the filling material used in the resonator, the electrode films 3, 4, 5, 6 and 7, and the through holes S1 and V1, with the advantage of improving the Q factor. The following is the reason for this. If materials having a high burning temperature are employed as the dielectric layers 2, precious metals with high melting points such as palladium have to be used as the material to form the electrode film 3 and as the filling material for the through holes S1 and V1. This increases the production cost. The use of precious metals such as palladium causes deterioration of the conductivity, lowering the Q factor. Therefore, a material capable of firing at a low temperature, for which conductive materials such as Cu or Ag can be used, is employed as the dielectric layers to raise the Q factor. This also contributes to reducing the cost because comparatively inexpensive materials such as Cu or Ag can be used in this case.

The present invention is not limited to a layered type of substrate of the above construction but is also applicable to a layered type of substrate of other constructions. For example, various types of capacitors may be built in the substrate 1 together with the resonator.

Although the present invention has been fully described by way of examples with reference to the accompanying drawings, it is to be noted that various changes and modification will be apparent to those skilled in the art. Therefore, unless otherwise such changes and modifications depart from the scope of the present invention, they should be construed as being included therein.

What is claimed is:

1. A voltage controlled oscillator having a resonator, comprising:
   a substrate made up of a plurality of dielectric layers, said substrate being made from one of the dielectric materials $BaO\text{-}SiO_2\text{-}Al_2O_3$ and $BaO\text{-}SrO\text{-}SiO_2\text{-}ZrO_2$;
   an inductor functioning conductive film, grounding electrode films, and a capacitor electrode film each formed at a boundary surface of one of the dielectric layers, said grounding electrode films being arranged, in the direction in which the dielectric layers are laminated, at both sides of said inductor functioning conductive film;
   said inductor functioning conductive film and a pair of said grounding electrode films constituting the resonator;
   all of said films being made from one of Ag and Cu; and
   electric lands formed on the surface of said substrate so that other components of the oscillator are mounted thereon.

2. A voltage controlled oscillator having a resonator of claim 1, wherein said inductor functioning conductive film and said grounding electrode films form the strip line type resonator.

3. A voltage controlled oscillator having a resonator of claim 2, wherein said capacitor electrode film forms capacitance between itself and the facing grounding electrode film.

4. A voltage controlled oscillator having a resonator of claim 3, wherein each of said films and the electric lands are connected with one another via through holes filled with conductive material.

5. A voltage controlled oscillator having a resonator of claim 3, wherein another electrode film is formed at a boundary surface of one of the dielectric layers of the substrate.

6. A voltage controlled oscillator having a resonator of claim 5, said another electrode film is a capacitor electrode opposite to said grounding electrode films.

7. A voltage controlled oscillator having a resonator of claim 6, said capacitor electrode is disposed between said grounding electrode films and the upper surface of the substrate without electrically contacting with said through holes.

8. A voltage controlled oscillator having a resonator of claim 1, wherein the electrode films and the conductive film are made from metallic material with a low melting point.

* * * * *